(12) United States Patent
Choi (10) Patent No.: US 8,487,404 B2
(45) Date of Patent: Jul. 16, 2013

(54) FUSE PATTERNS AND METHOD OF MANUFACTURING THE SAME

(75) Inventor: Ki Soo Choi, Cheongju (KR)

(73) Assignee: Hynix Semiconductor Inc., Icheon (KR)

( * ) Notice: Subject to any disclaimer, the term of this patent is extended or adjusted under 35 U.S.C. 154(b) by 24 days.

(21) Appl. No.: 13/346,997

(22) Filed: Jan. 10, 2012

(65) Prior Publication Data

US 2012/0228735 A1    Sep. 13, 2012

(30) Foreign Application Priority Data

Mar. 11, 2011  (KR) .................. 10-2011-0022002

(51) Int. Cl.
*H01L 23/525*    (2006.01)

(52) U.S. Cl.
USPC ............ 257/529; 257/E23.149; 257/E21.592; 257/E21.205; 438/601; 438/132; 438/215; 438/381

(58) Field of Classification Search
USPC .......... 257/E23.149, E21.592, 529; 438/601, 438/132, 215, 381
See application file for complete search history.

(56) References Cited

U.S. PATENT DOCUMENTS

| 4,814,853 A | * | 3/1989 | Uchida .................. 257/530 |
| 5,412,593 A | | 5/1995 | Magel et al. |

FOREIGN PATENT DOCUMENTS

| JP | 07-312393 A | 11/1995 |
| KR | 10-2007-0076282 A | 7/2007 |

* cited by examiner

*Primary Examiner* — Zandra Smith
*Assistant Examiner* — Paul Patton (57) ABSTRACT

The present invention provides fuse patterns and a method of manufacturing the same. According to the present invention, an insulating layer and a contact plug are filled between fuse patterns which are formed to have their ends broken and are isolated from each other. In case of a fail cell, the insulating layer is broken owing a difference in an electrical bias (current or voltage) between a metal wire and the fuse patterns, and a short is generated between the fuse patterns. Accordingly, embodiments avoid damage to a semiconductor substrate associated with a conventional fuse repair method employing laser energy, and the area of a fuse box can be reduced.

25 Claims, 7 Drawing Sheets

FUSE PATTERNS AND METHOD OF MANUFACTURING THE SAME

CROSS-REFERENCE TO RELATED APPLICATION

Priority to Korean patent application number 10-2011-0022002, filed on Mar. 11, 2011, which is incorporated by reference in its entirety, s is claimed.

BACKGROUND OF THE INVENTION

Embodiments of the present invention relate to fuse patterns and a method of manufacturing the same. With the recent rapid spread of information media, such as computers, semiconductor devices are making rapid progress. In terms of its function, the semiconductor device is required to be operated at high speed and also to have a high storage capacity. Accordingly, the semiconductor device is developing toward the improvement of the degree of integration, reliability, a response speed, is etc.

The semiconductor device is formed by a fabrication (FAB) process of forming cells, each having an integrated circuit, by repeatedly forming circuit patterns on a substrate chiefly made of silicon and an assembly process of packaging the substrate in which the cells are formed by the cell. An electrical die sorting (EDS) process of testing electrical characteristics of the cells formed on the substrate is performed between the fabrication process and the assembly process.

The test process is performed in order to determine whether the cells formed on the substrate have an electrically good or fail state. Efforts and costs necessary for the assembly process can be reduced by removing a cell having a fail state through the test process before the assembly process is performed. Furthermore, a cell having a fail state is previously detected and may be recycled through a repair process.

The repair process is described in more detail below.

In order to improve the yield of semiconductor devices, redundant cells for replacing fail elements or fail circuits when the devices are designed are added if a fail is detected in a process of manufacturing the semiconductor devices. Fuses, together with the redundant cells, are designed in order to couple the redundant cells to the integrated circuits.

The repair process is performed to recycle cells, determined to be failed by the test process, by coupling the fail cells and the redundant cells embedded in chips using the fuses. In the repair process, formation about the locations of cells to be repaired is generated by cutting only specific fuses.

A known method of repairing a semiconductor device is described in short below.

First, after an interlayer insulating layer having a flat surface is deposited on the fuse region of a semiconductor substrate, a plurality of fuse patterns is formed on the interlayer insulating layer. An insulating layer is deposited on the result of the semiconductor substrate so that the fuse patterns are covered. Repair trenches where the insulating layer of a specific thickness remain on a reserved blowing region (i.e., the fuse patterns) are formed by etching the insulating layer in a specific thickness.

Next, known test and repair processes, including a fuse blowing process of cutting a specific fuse by radiating a laser to the fuse region of the semiconductor substrate, are sequentially performed.

As described above, the insulating layer is formed on the entire surface including the fuses, and some regions of the fuses are subjected to laser blowing. However, as a pattern size reduces, the blowing size also reduces accordingly. Thus, in order to accurately target a specific area, a laser used should be adjusted to have a smaller wavelength and higher energy density. When the laser blowing is performed using a laser having higher energy density, laser energy radiated is undesirably transferred down to the semiconductor substrate, damaging the substrate.

BRIEF SUMMARY OF THE INVENTION

In an aspect, the present invention provides a method of manufacturing a semiconductor device, including forming a first insulating layer on a semiconductor substrate, forming first wires isolated from each other over the first insulating layer, forming second insulating layers over the first wires and the first insulating layer, forming first contact plugs, coupled to the first wires, within the second insulating layers, respectively, forming fuse patterns formed on the upper parts of the second insulating layers, coupled to the first contact plug, and isolated from each other, forming a third insulating layer on top surfaces of the fuse patterns and the second insulating layers, forming a fourth insulating layer on the third insulating layer, forming second contact plugs each formed within the fourth insulating layer between the fuse patterns isolated from each other, and forming second wires on the second contact plugs, respectively.

Each of the fuse patterns preferably includes copper (Cu) or aluminum (Al).

Each of the first wires preferably includes metal.

The metal preferably includes aluminum (Al), tungsten (W), cobalt (Co), titanium (Ti), tungsten silicide, cobalt silicide, or titanium silicide.

The third insulating layer preferably includes nitride.

The forming-second-contact-plugs-each-formed-within-the-fourth-insulating-layer-between-the-isolated-fuse-patterns preferably includes forming contact holes by etching the fourth insulating layer until the third insulating layer between the isolated fuse patterns is exposed by using a mask for forming the contact plugs and burying the contact holes with conductive material.

The second wires preferably are formed in a direction vertical to the fuse patterns and formed in a line form.

Preferably, in case of a fail cell, the third insulating layer is cut owing to an electrical bias difference between the second wire and the isolated fuse patterns, so that the isolated fuse patterns are coupled to the second contact plug.

In another aspect, the present invention provides a semiconductor device, including a first insulating layer provided on a semiconductor substrate, first wires isolated from each other and provided over the first insulating layer, second insulating layers provided over the first wires and the first insulating layer, first contact plugs provided within the second insulating layers and coupled to the first wires, respectively, fuse patterns isolated from each other, provided on upper parts of the second insulating layers, and coupled to the first contact plugs, respectively, a third insulating layer provided on top surfaces of the fuse patterns and the second insulating layers, a fourth insulating layer provided on the third insulating layer, second contact plugs each provided within the fourth insulating layer between the fuse patterns isolated from each other, and second wires provided on the second contact plugs, respectively.

Each of the fuse patterns preferably includes copper (Cu) or aluminum (Al).

Each of the first wires preferably includes metal.

The metal preferably includes aluminum (Al), tungsten (W), cobalt (Co), titanium (Ti), tungsten silicide, cobalt silicide, or titanium silicide.

The third insulating layer preferably includes nitride.

The second wires preferably are formed in a direction vertical to the fuse patterns and formed in a line form.

Preferably, in case of a fail cell, the third insulating layer is cut owing to an electrical bias difference between the second wire and the isolated fuse patterns, so that the isolated fuse patterns are coupled to the second contact plug.

DESCRIPTION OF EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Figure 1A:
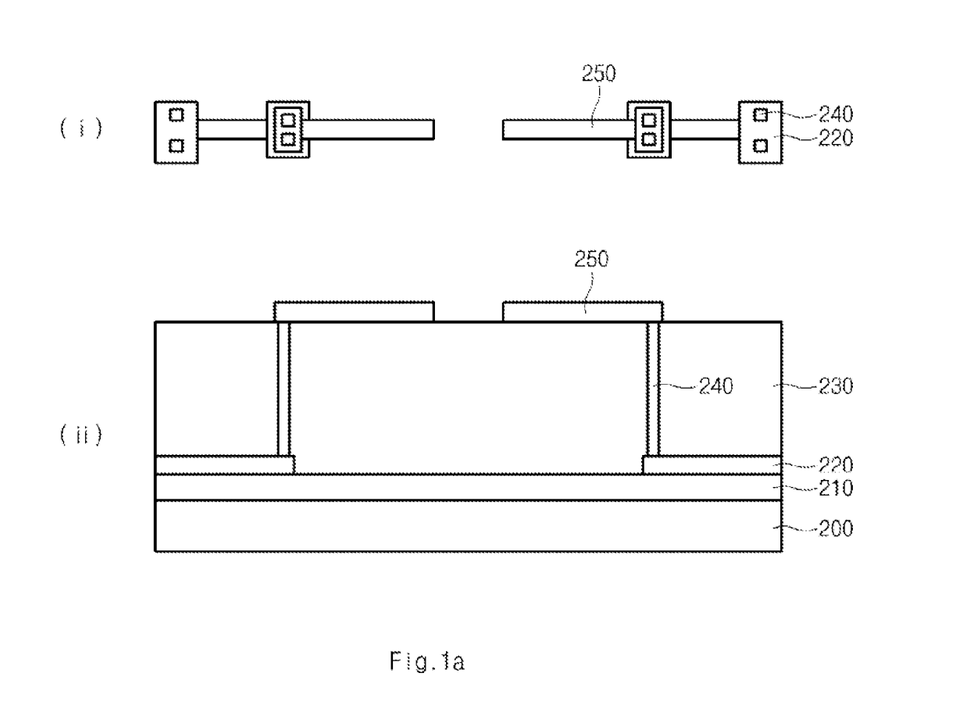
FIGS. 1a and 1b are cross-sectional views showing a semiconductor device including fuse patterns and a method of manufacturing the same according to the present invention.
Figure 1B:
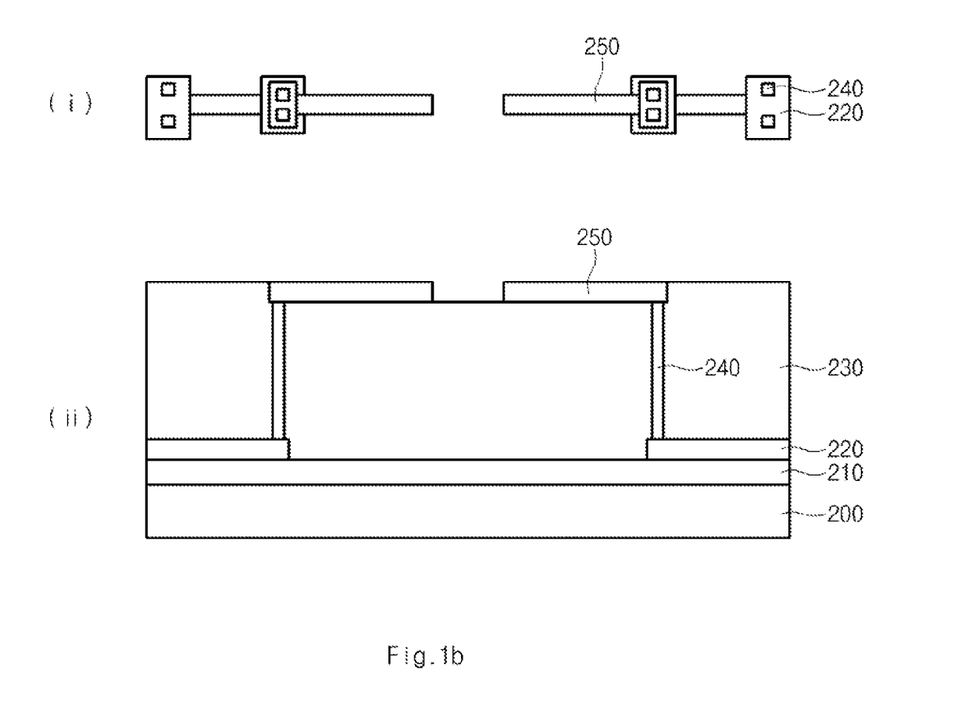

FIGS. 1a and 1b are cross-sectional views showing a semiconductor device including fuse patterns and a method of manufacturing the same according to the present invention. FIGS. 1a and 1b illustrate different methods of forming fuse patterns, and (i) of FIG. 1 is a layout diagram and (ii) of FIG. 1 is a cross-sectional view. Referring to FIGS. 1a and 1b, a first insulating layer 210 is formed on a semiconductor substrate 200. It is preferred that the first insulating layer 210 includes oxide.

A first conductive layer (not shown) is formed on the first insulating layer 210. After a photoresist layer is formed on the first conductive layer, photoresist patterns (not shown) are formed by exposure and development processes employing a wire mask. First wires 220 are formed by etching the first conductive layer using the photoresist patterns as a mask. The first wires 220 may include polysilicon, one or more metals, and silicide. Examples of metal include but are not limited to aluminum (Al), tungsten (W), cobalt (Co), or titanium (Ti). A silicide may include tungsten silicide, cobalt silicide, or titanium silicide.

Second insulating layers 230 are formed on the first wires 220 and the exposed first insulating layer 210. The second insulating layer 230 may include oxide.

After a photoresist layer is formed on the second insulating layers 230, photoresist patterns (not shown) are formed by exposure and development processes employing a contact plug mask. The second insulating layers 230 are etched by using the photoresist patterns as a mask until the first wires 220 are exposed, thereby forming contact plug regions (not shown). Contact plugs 240 are formed in the respective contact plug regions by burying the contact plug regions with a conductive layer.

As shown in FIG. 1a, after a metal layer (not shown) is formed on the contact plugs 240 and the second insulating layers 230, fuse patterns 250 coupled to the contact plugs 240 and isolated apart from each other are formed by etching the metal layer. The fuse patterns 250 may include aluminum (Al).

As another embodiment of a method of forming the fuse patterns of FIG. 1a, the fuse patterns 250 isolated from each other may be formed by using a damascene method, as shown in FIG. 1b. Regions where the fuse patterns 250 will be present are formed. After copper (Cu) is deposited, an insulating layer between the fuse patterns 250 isolated from each other is removed by etching copper (Cu) using chemical mechanical polishing (CMP).

FIGS. 2 to 6 are cross-sectional views showing fuse patterns and a method of manufacturing the same according to embodiments of the present invention. The method is described according to sequence of the manufacturing method of FIG. 1b.

Figure 2:
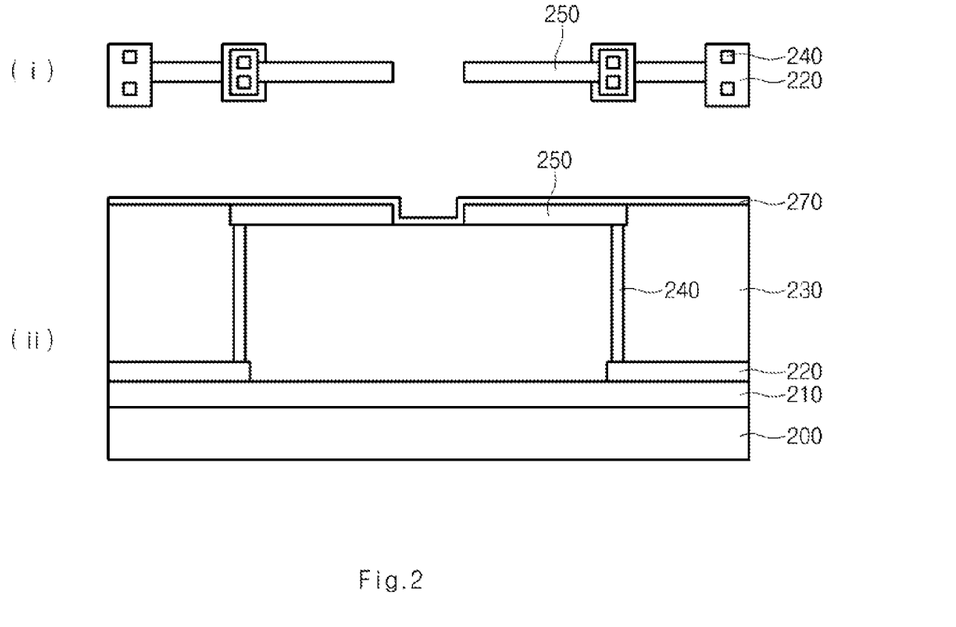
FIGS. 2 to 5 are cross-sectional views showing fuse patterns and a method of manufacturing the same according to an embodiment of the present invention.

Referring to FIG. 2, after fuse patterns 250 are formed as in FIG. 1b, a third insulating layer 270 is formed between the fuse patterns 250, on a top surface of the fuse patterns 250, and a top surface of second insulating layers 230. The third insulating layer 270 may include nitride.

Figure 3:
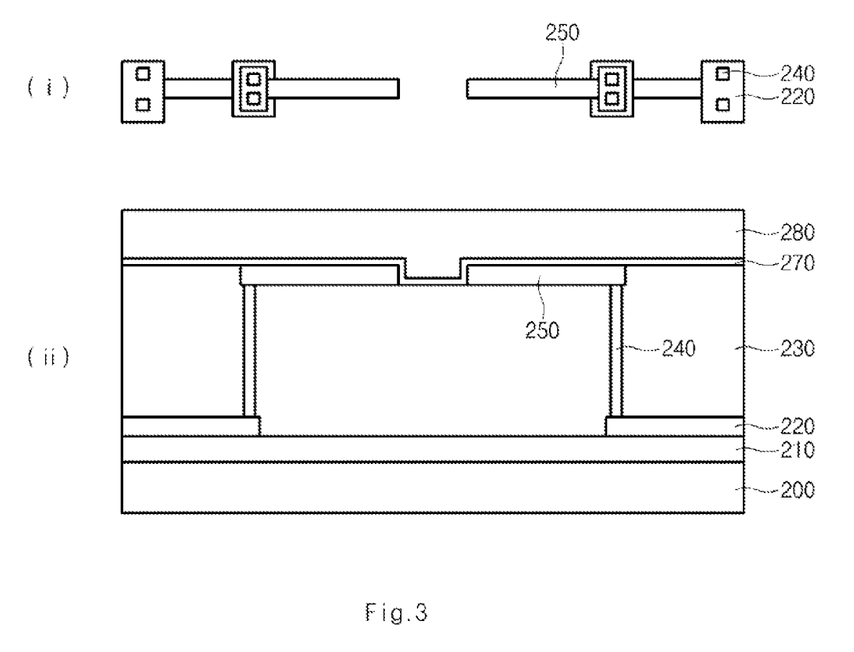

Referring to FIG. 3, a fourth insulating layer 280 is formed on the third insulating layer 270. The fourth insulating layer 280 may include oxide.

Figure 4:
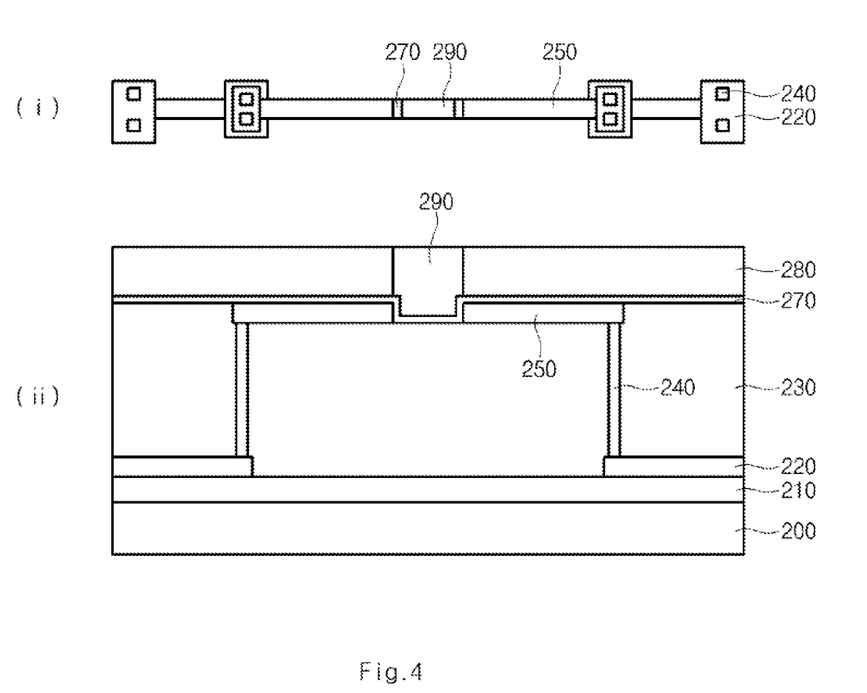

Referring to FIG. 4, after a photoresist layer is formed on the fourth insulating layer 280, photoresist patterns (not shown) are formed by exposure and development processes employing a mask for forming contact plugs, each exposed between the fuse patterns isolated from each other. The fourth insulating layer 280 is etched by using the photoresist patterns as an etch mask until the third insulating layer 270 is exposed, thereby forming contact holes (not shown).

After conductive material is deposited in the contact holes, contact plugs 290 are formed in the respective contact holes by etching back the conductive material. In this case, the conductive material may include tungsten (W).

Figure 5:
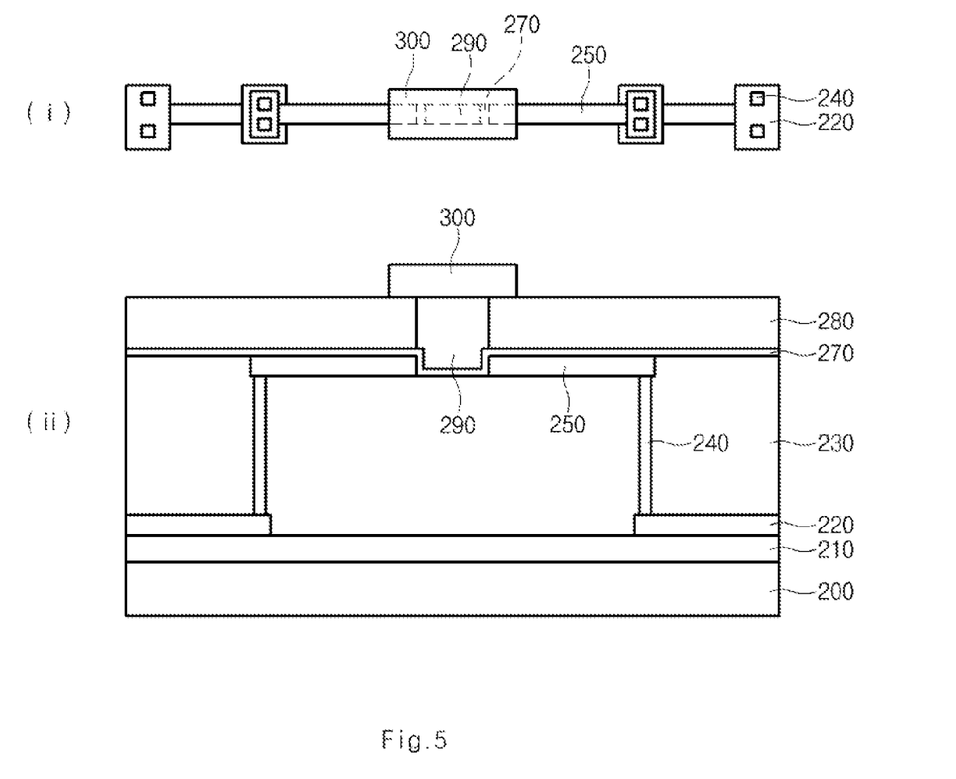

Referring to FIG. 5, second wires 300 are formed on the respective contact plugs 290. The second wires 300 may be formed in a direction vertical to the fuse patterns 250 and have a line structure. In case of a fail cell, when high voltage is supplied to the second wire 300 and a bias is supplied to the fuse patterns 250, the third insulating layer 270 is broken by a bias difference between the second wire 300 and the fuse patterns 250 and thus an electrical short occurs between the fuse pattern 250 and the contact plug 290 (or the second wires 300). Here, the contact plug 290 and the second wires 300 are also collectively referred to as the electrical bias applying pattern (290, 300). The broken fuse pattern 250 functions as on-state, and an unbroken fuse pattern functions as an off-state. As such, the third insulating layer 270 (or the switching insulation film) functions as a switch.

Figure 6:
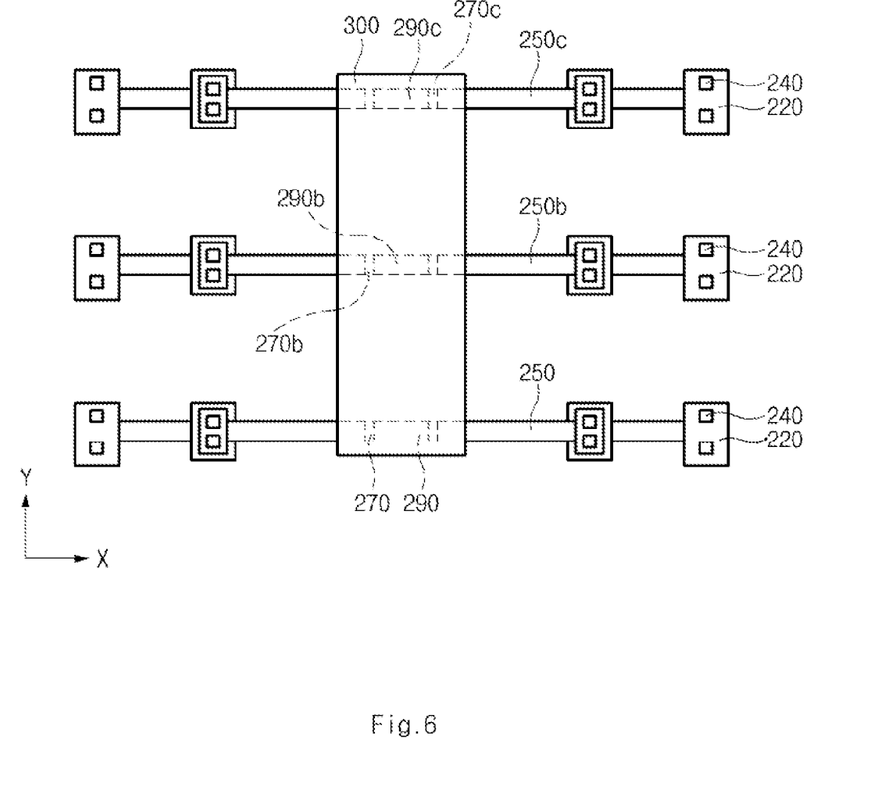
FIG. 6 shows a plan view of the fuse patterns according to an embodiment of the present invention.

As shown in FIGS. 6, a semiconductor device according to an embodiment of the present invention includes a first fuse (250) coupled to a first component (not shown), and a first electrical bias applying pattern (290, 300) coupled to the first fuse through a first switching insulation film (270). The first switching insulation film (270) is configured to be cut and couple the first fuse (250) to the first electrical bias applying pattern (290, 300) when a first given electrical bias is formed between the first fuse (250) and the first electrical bias applying pattern (290, 300). The first given electric bias is formed when a repair signal related to the first fuse is applied. The first switching insulation film (270) is formed between the first fuse (250) and the first electrical bias applying pattern (290, 300).

The given electrical bias is formed by applying a first voltage or a first current to the electrical bias applying pattern (290, 300). Alternatively, the given electrical bias is formed by (i) applying a first voltage or a first current to the electrical bias applying pattern (290, 300), and (ii) applying a second voltage or a second current to the first fuse (250) at the same time.

The device may further includes a second fuse (250b, 250c) coupled to the first electrical bias applying pattern (290, 300) through a second switching insulation film (270b, 270c). Instead of being coupled to the first electrical bias applying pattern (290, 300), the second fuse (250b, 250c) may be coupled to a second electrical bias applying pattern (290, 300) through a second switching insulation film (270b, 270c).

The second switching insulation film (270b, 270c) is configured to be cut and couple the second fuse (250) to the first electrical bias applying pattern (290, 300) when a second given electrical bias is formed between the second fuse (250) and the first electrical bias applying pattern (290, 300)

The first and the second fuses (250, 250b, 250c) are formed at a first level and each arranged along a first direction (X direction). The first electrical bias applying pattern (290, 300) is formed at a second level higher than the first level and arranged along a second direction (Y direction) perpendicular to the first direction. The first and the second fuses (250, 250b, 250c) are coupled to the first electrical bias applying pattern (300) through first and second contacts (290, 290b, 290c), respectively. Here, the first and the second switching insulation films (270) are formed between the first and the second contacts (290, 290b, 290c) and the first and the second fuses (250, 250b, 250c), respectively.

The first and the second contacts (290, 290b, 290c) are formed intersections of the first and the second fuses (250, 250b, 250c) and the first electrical bias applying pattern (300), respectively. The first and the second contacts (290, 290b, 290c) are formed between the first and the second levels and each arranged along a third direction (Z direction) perpendicular to both of the first and the second directions.

As described above, according to certain embodiments of the present invention, for a fuse repair, the present invention employs an electrical switch using electrical bias, instead of a blowing process. When a fail cell is found, a repair signal is applied in relation to a fuse (250) that is coupled to the failed cell. Then, a given voltage is applied to an electrical bias applying pattern (290, 300) to form an electrical bias between the fuse (250) and the electrical bias applying pattern (290, 300).

Due to the electrical bias, a switching insulation film 270 coupled to the fuse that is coupled to the failed cell is broken, and an electrical short occurs between the fuse pattern 250 and the contact plug 290 (or the second wires 300). Accordingly, embodiments of the present invention may avoid damage to a semiconductor substrate due to conventional application of laser energy, and the area of a fuse box can be reduced.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method of manufacturing a semiconductor device, comprising:
    forming a first insulating layer over a semiconductor substrate;
    forming first wires isolated from each other over the first insulating layer;
    forming second insulating layer over the first wires and the first insulating layer;
    forming first contact plugs, respectively coupled to the first wires, within the second insulating layer,
    forming fuse patterns formed over upper parts of the second insulating layer, wherein the fuse patterns are coupled to the first contact plugs, respectively, and isolated from each other;
    forming a third insulating layer over top surfaces of the fuse patterns and the second insulating layers;
    forming a fourth insulating layer over the third insulating layer;
    forming second contact plugs each formed within the fourth insulating layer between the fuse patterns; and
    forming second wires on the second contact plugs, respectively.

2. The method according to claim 1, wherein each of the fuse patterns comprises copper (Cu) or aluminum (Al).

3. The method according to claim 1, wherein each of the first wires comprises metal.

4. The method according to claim 3, wherein the metal comprises aluminum (Al), tungsten (W), cobalt (Co), titanium (Ti), tungsten silicide, cobalt silicide, or titanium silicide.

5. The method according to claim 1, wherein the third insulating layer comprises nitride.

6. The method according to claim 1, wherein the forming-second-contact-plugs-each-formed-within-the-fourth-insulating-layer-between-the-isolated-fuse-patterns comprises:
    forming contact holes by etching the fourth insulating layer until the third insulating layer between the isolated fuse patterns is exposed by using a mask for forming the contact plugs; and
    filling the contact holes with conductive material.

7. The method according to claim 1, wherein the second wires are formed in a direction vertical to the fuse patterns and formed in a line form.

8. The method according to claim 1, wherein when a fail cell is found, the third insulating layer is cut by an electrical bias difference between any of the second wires and any of the isolated fuse patterns, so that the isolated fuse patterns are coupled to the second contact plug.

9. The method according to claim 1 wherein forming fuse patterns comprises performing a damascene process.

10. The method according to claim 1 wherein forming fuse patterns comprises performing a metal etching process.

11. A semiconductor device, comprising:
    a first insulating layer provided on a semiconductor substrate;
    first wires isolated from each other and provided over the first insulating layer;
    second insulating layers provided over the first wires and the first insulating layer;
    first contact plugs provided within the second insulating layers and coupled to the first wires, respectively;
    fuse patterns isolated from each other, provided over upper parts of the second insulating layers, and coupled to the first contact plugs, respectively;
    a third insulating layer provided over top surfaces of the fuse patterns and the second insulating layers;
    a fourth insulating layer provided over the third insulating layer;

second contact plugs each provided within the fourth insulating layer between the fuse patterns; and second wires provided on the second contact plugs, respectively.

12. The semiconductor device according to claim 11, wherein each of the fuse patterns comprises copper (Cu) or aluminum (Al).

13. The semiconductor device according to claim 11, wherein each of the first wires comprises metal.

14. The semiconductor device according to claim 13, wherein the metal comprises aluminum (Al), tungsten (W), cobalt (Co), titanium (Ti), tungsten silicide, cobalt silicide, or titanium silicide.

15. The semiconductor device according to claim 11, wherein the third insulating layer comprises nitride.

16. The semiconductor device according to claim 11, wherein the second wires are formed in a direction vertical to the fuse patterns and formed in a line form.

17. The semiconductor device according to claim 11, wherein in case of a fail cell, the third insulating layer is cut by an electrical bias difference between any of the second wires and any of the isolated fuse patterns, so that the isolated fuse patterns are coupled to the second contact plug.

18. A semiconductor device, comprising:
a first fuse, and
a first electrical bias applying pattern coupled to the first fuse through a first switching insulation film,
wherein the first switching insulation film is configured to be cut and couple the first fuse to the first electrical bias applying pattern when a first given electrical bias is formed between the first fuse and the first electrical bias applying pattern.

19. The semiconductor device of claim 18, wherein the first given electric bias is formed when a repair signal related to the first fuse is applied.

20. The semiconductor device of claim 18, comprising:
wherein the first switching insulation film is formed between the first fuse and the first electrical bias applying pattern.

21. The semiconductor device of claim 18, comprising:
wherein the given electrical bias is formed by applying a first voltage or a first current to the electrical bias applying pattern.

22. The semiconductor device of claim 18, comprising:
wherein the given electrical bias is formed by (i) applying a first voltage or a first current to the electrical bias applying pattern, and (ii) applying a second voltage or a second current to the first fuse.

23. The semiconductor device of claim 18, the device further comprising a second fuse coupled to the first electrical bias applying pattern through a second switching insulation film,
wherein the second switching insulation film is configured to be cut and couple the second fuse to the first electrical bias applying pattern when a second given electrical bias is formed between the second fuse and the first electrical bias applying pattern.

24. The semiconductor device of claim 23,
wherein the first and the second fuses are formed at a first level and each arranged along a first direction (X direction),
wherein the first electrical bias applying pattern is formed at a second level higher than the first level and arranged along a second direction (Y direction) perpendicular to the first direction,
wherein the first and the second fuses are coupled to the first electrical bias applying pattern through first and second contacts, respectively, and
wherein the first and the second switching insulation films are formed between the first and the second contacts and the first and the second fuses, respectively.

25. The semiconductor device of claim 24,
wherein the first and the second contacts are formed intersections of the first and the second fuses and the first electrical bias applying pattern, respectively, and
wherein the first and the second contacts are formed between the first and the second levels and each arranged along a third direction (Z direction) perpendicular to both of the first and the second directions.

* * * * *